US008263496B1

(12) United States Patent
Wodecki

(10) Patent No.: US 8,263,496 B1
(45) Date of Patent: Sep. 11, 2012

(54) ETCHING METHOD FOR PREPARING A STEPPED STRUCTURE

(75) Inventor: Norman Wodecki, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/153,266

(22) Filed: Jun. 3, 2011

Related U.S. Application Data

(60) Provisional application No. 61/474,658, filed on Apr. 12, 2011.

(51) Int. Cl.
  $H01L\ 21/302$ (2006.01)
(52) U.S. Cl. .............. 438/689; 430/5; 216/22; 257/98
(58) Field of Classification Search .................... None
  See application file for complete search history.

(56) References Cited

U.S. PATENT DOCUMENTS

| 4,902,377 A * | 2/1990 | Berglund et al. ............ 438/640 |
| 5,288,568 A * | 2/1994 | Cathey, Jr. ................... 430/5 |
| 5,300,816 A * | 4/1994 | Lee et al. ..................... 257/797 |
| 5,487,962 A * | 1/1996 | Rolfson ....................... 430/5 |
| 5,672,450 A * | 9/1997 | Rolfson ....................... 430/5 |
| 6,534,403 B2 | 3/2003 | Cleeves |
| 6,664,639 B2 | 12/2003 | Cleeves |
| 2003/0003371 A1* | 1/2003 | Flanders et al. ............. 430/5 |
| 2005/0274968 A1* | 12/2005 | Kuo et al. .................... 257/98 |
| 2009/0023078 A1 | 1/2009 | Gutmann et al. |

\* cited by examiner

Primary Examiner — Binh X Tran
Assistant Examiner — David Cathey, Jr.
(74) Attorney, Agent, or Firm — Wood, Herron & Evans, LLP

(57) ABSTRACT

A method of preparing a stepped structure in a multi-layer film stack on a substrate is described. The multi-layer film stack includes alternating layers of differing composition, wherein the alternating layers of differing composition include one or more layers of a first composition and one or more layers of a second composition. The method includes transferring a mask pattern to the one or more layers of the first composition to form a first layer pattern in the one or more layers of the first composition using a first etch process, trimming the mask pattern to expose another portion of the one or more layers of the first composition using a mask trim process, and following the trimming, transferring the first layer pattern to the one or more layers of the second composition using a second etch process.

20 Claims, 10 Drawing Sheets

ETCHING METHOD FOR PREPARING A STEPPED STRUCTURE

CROSS-REFERENCE TO RELATED APPLICATIONS

Pursuant to 37 CFR §1.78(a)(4), this application claims the benefit of and priority to U.S. Provisional Application No. 61/474,658, filed on Apr. 12, 2011, the entire content of which is herein incorporated by reference.

BACKGROUND OF THE INVENTION

1. Field of Invention

The invention relates to a method for a forming stepped structure in a multi-layer film stack on a substrate.

2. Description of Related Art

Advanced integrated circuits and memory devices incorporate stepped structures formed in multi-layer film stacks. Using dry pattern etching techniques, including plasma etch processes, a mask pattern is extended into the multi-layer film stack to form the stepped structure.

For example, a conventional method for preparing a stepped structure is illustrated in FIG. 1. The conventional method includes a process sequence 100 beginning with preparing a multi-layer film stack, including alternating first layers (125A, 125B) and second layers (120A, 120B) formed on or above substrate 110. A mask layer 130 having mask pattern 131 formed therein is prepared on or above the multi-layer film stack.

In 101A, the mask pattern 131 is transferred to the underlying first layer 125A using a first etch process to form a first layer pattern 121. Immediately thereafter, in 102A, the mask pattern 131 is further transferred to the underlying second layer 120A using a second etch process. Once the mask pattern is extended into the first layer 125A and the second layer 120A, the mask pattern 131 in mask layer 130 is trimmed in 103A to expose another portion 145 of the multi-layer film stack. However, the second etching process is known to alter or passivate an exposed surface 140 of mask layer 130, thus, interfering with the subsequent trimming of mask layer 130.

In 101B, 102B, and 103B, the first and second etch processes are repeated to form a stepped structure 150 including first step 152 and second step 154. However, as noted above, the second etching process adversely affects the trimming of mask layer 130, thus, making the trimming of mask layer 130 deficient and causing a degradation of the stepped structure formation in subsequent cycles. As a result, the ability to produce a stepped structure having multiple, well-defined steps may be severely limited, and, in extreme circumstances, the conventional method fails.

SUMMARY OF THE INVENTION

The invention relates to a method for forming a stepped structure in a multi-layer film stack on a substrate.

According to one embodiment, a method of preparing a stepped structure in a multi-layer film stack on a substrate is described. The multi-layer film stack includes alternating layers of differing composition, wherein the alternating layers of differing composition include one or more layers of a first composition and one or more layers of a second composition. The method includes transferring a mask pattern to the one or more layers of the first composition to form a first layer pattern in the one or more layers of the first composition using a first etch process and stopping on the one or more layers of the second composition, trimming the mask pattern to expose another portion of the one or more layers of the first composition using a mask trim process, and following the trimming, transferring the first layer pattern to the one or more layers of the second composition using a second etch process and stopping on the one or more layers of the first composition.

DETAILED DESCRIPTION OF SEVERAL EMBODIMENTS

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

As discussed above, the conventional method fails when attempting to form a stepped structure in a multi-layer film stack on a substrate. In particular, at least one etching process adversely affects mask layer trimming during step formation.

Figure 1:
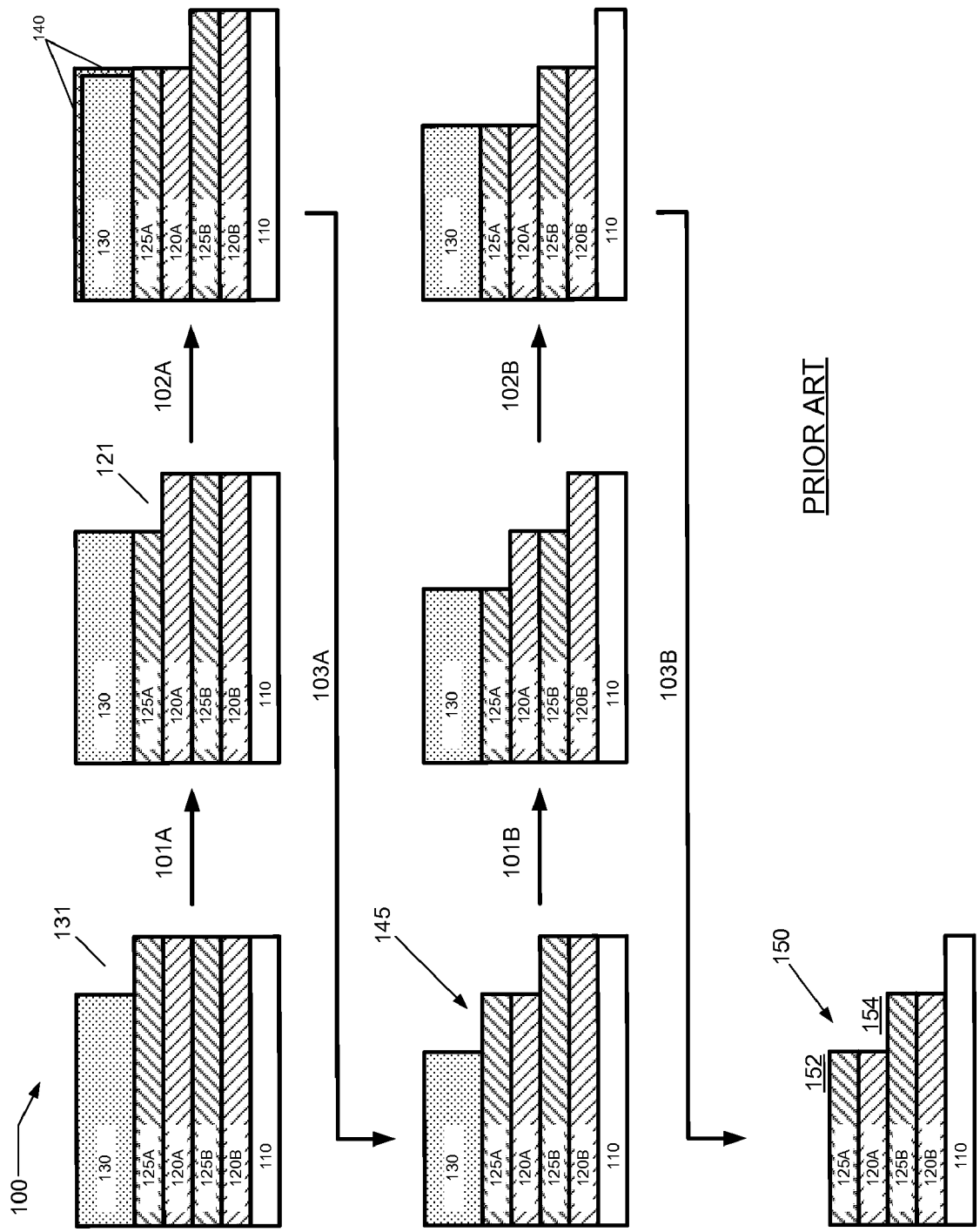
FIG. 1 illustrates a conventional method for preparing a stepped structure on a substrate according to the prior art.
Figure 2:
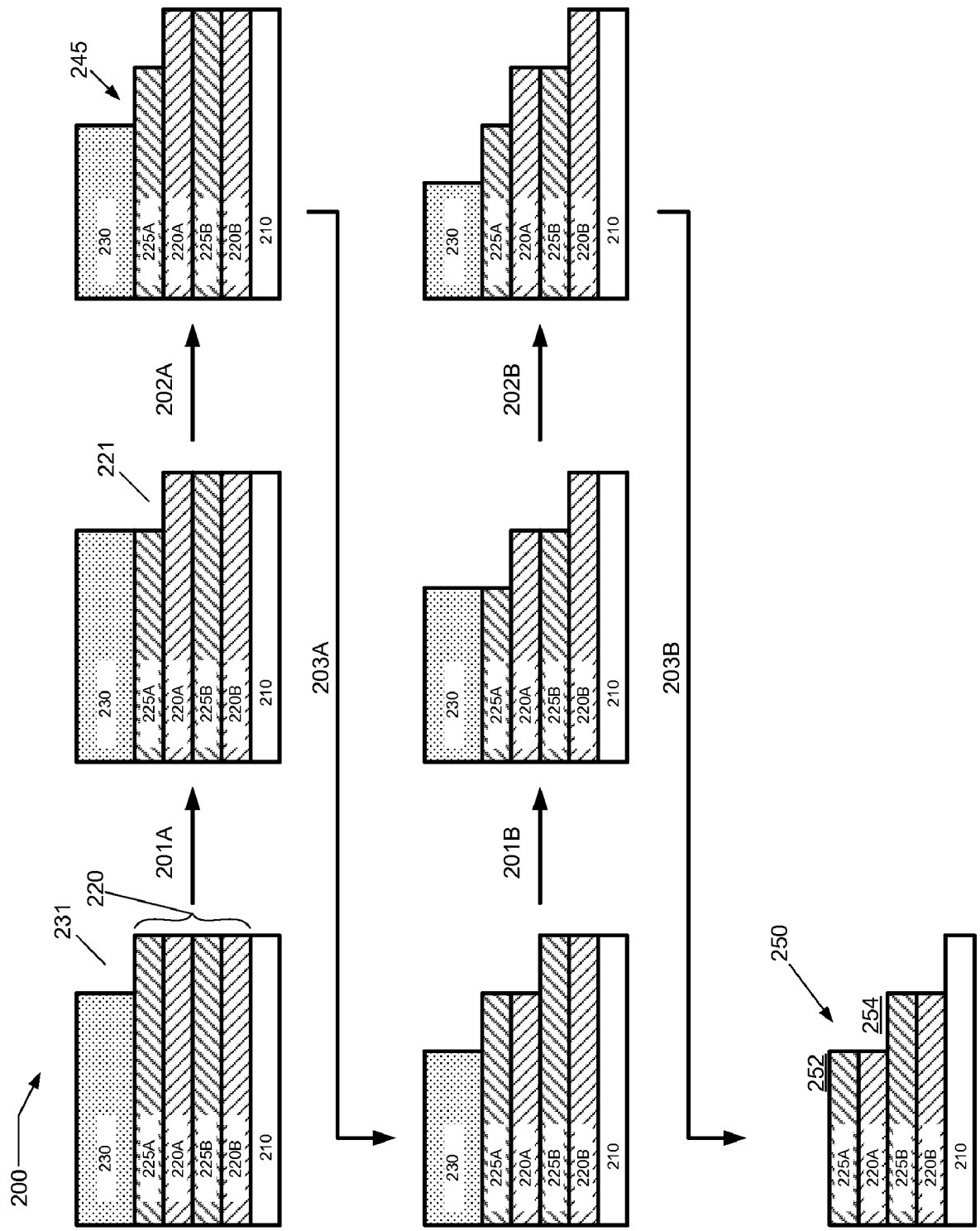
FIG. 2 illustrates a method for preparing a stepped structure on a substrate according to an embodiment of the invention.
Figure 3:
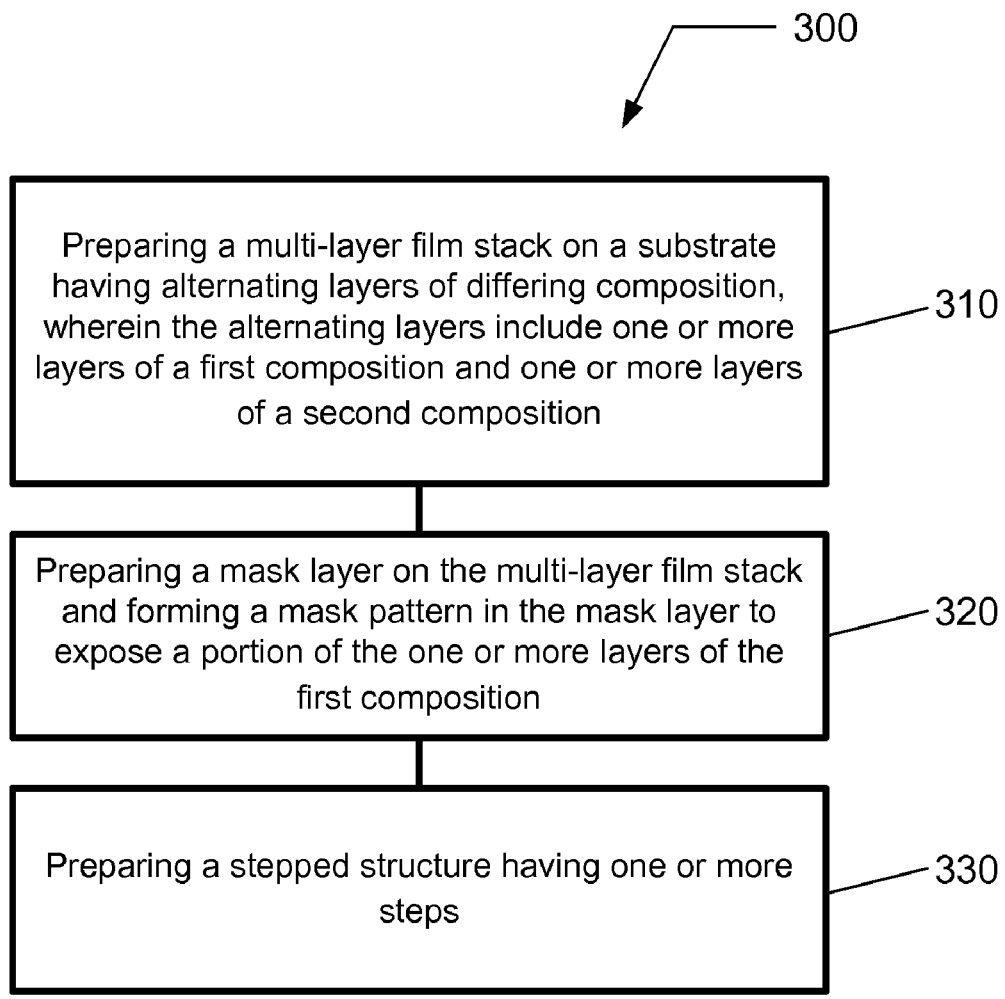
FIG. 3 provides a flow chart illustrating a method for preparing a stepped structure on a substrate according to an embodiment.

Therefore, according to an embodiment, a method for preparing a stepped structure on a substrate is illustrated in FIGS. 2 and 3. As illustrated pictorially in FIG. 2 and described in FIG. 3, the method comprises a process sequence 200 and flow chart 300 beginning in 310 with preparing a multi-layer film stack 220 on a substrate 210 having alternating layers of differing composition, wherein the alternating layers of differing composition include one or more layers of a first composition (225A, 225B) and one or more layers of a second composition (220A, 220B).

The one or more layers of a first composition (225A, 225B) may include a conductive material, a non-conductive material, or a semi-conductive material. As an example, the one or more layers of a first composition (225A, 225B) may include a silicon-containing material, or a metal-containing material. As another example, the one or more layers of a first composition (225A, 225B) may include Si and one or more elements selected from the group consisting of O, N, C, H, and Ge. As yet another example, the one or more layers of a first composition (225A, 225B) may include Si and O. The one or more layers of a first composition (225A, 225B) may include one or more sub-layers of differing material composition.

The one or more layers of a second composition (220A, 220B) may include a conductive material, a non-conductive material, or a semi-conductive material. As an example, the one or more layers of a second composition (220A, 220B) may include a silicon-containing material, or a metal-containing material. As another example, the one or more layers of a second composition (220A, 220B) may include Si and one or more elements selected from the group consisting of O, N, C, H, and Ge. As yet another example, the one or more layers of a second composition (220A, 220B) may include Si, such as polycrystalline silicon (poly-Si). The one or more layers of a second composition (220A, 220B) may include one or more sub-layers of differing material composition.

In 320, a mask layer 230 is prepared on the multi-layer film stack 220 and a mask pattern 231 is formed in the mask layer 230 to expose a portion of the one or more layers of the first composition (225A, 225B). The mask layer 230 may comprise one or more layers, wherein the one or more layers includes a soft mask layer, a hard mask layer, a layer of radiation-sensitive material, a layer of photo-sensitive material, a layer of photoresist, an anti-reflective coating (ARC) layer, an organic dielectric layer (ODL), or an organic planarization layer (OPL), or any combination of two or more thereof.

In 330, a stepped structure 250 having one or more steps (252, 254) is prepared using process sequence 200. Process sequence 200 begins in 201A with transferring the mask pattern 231 to the one or more layers of the first composition (225A, 225B) to form a first layer pattern 221 in the one or more layers of the first composition (225A, 225B) using a first etch process and stopping on the one or more layers of the second composition (220A, 220B).

The first etch process may include a dry etch process or wet etch process. Additionally, the first etch process may include a dry plasma etch process or a dry non-plasma etch process. Furthermore, the first etch process may include a dry plasma etch process with plasma formed using a process gas having as an incipient ingredient a halogen-containing gas. Further yet, the first etch process may include a dry plasma etch process with plasma formed using a process gas having as an incipient ingredient a fluorocarbon gas, or a fluorohydrocarbon gas, or both a fluorocarbon gas and a fluorohydrocarbon gas. The process gas may further include a noble gas. As an example, the second etch process may include forming plasma using a process gas containing $CF_4$ and $CHF_3$.

Thereafter, process sequence 200 continues in 202A with trimming the mask pattern 231 to expose another portion 245 of the one or more layers of the first composition (225A, 225B) using a mask trim process. The mask trim process may include a dry etch process or wet etch process. Additionally, the mask trim process may include a dry plasma etch process or a dry non-plasma etch process. Furthermore, the mask trim process may include a dry plasma etch process with plasma formed using a process gas having as an incipient ingredient an oxygen-containing gas, a nitrogen-containing gas, or a hydrogen-containing gas, or any combination of two or more thereof. The process gas may further include a noble gas. As an example, the mask trim process may include forming plasma using a process gas containing $O_2$, NO, $NO_2$, $N_2O$, CO, $CO_2$, or $N_2$, or any combination of two or more thereof. As another example, the mask trim process may include forming plasma using a process gas containing $NH_3$, $H_2$, or $N_2$, or any combination of two or more thereof. As yet another example, the mask trim process may include forming plasma using a process gas containing $NF_3$, or $SF_6$, or both $NF_3$ and $SF_6$. Mixtures of these process gases are also contemplated.

Thereafter, following the trimming of mask layer 230, process sequence 200 further continues in 203A with transferring the first layer pattern 221 to the one or more layers of the second composition (220A, 220B) using a second etch process and stopping on the one or more layers of the first composition (225A, 225B).

The second etch process may include a dry etch process or wet etch process. Additionally, the second etch process may include a dry plasma etch process or a dry non-plasma etch process. Furthermore, the second etch process may include a dry plasma etch process with plasma formed using a process gas having as an incipient ingredient a halogen-containing gas. Further yet, the second etch process may include a dry plasma etch process with plasma formed using a process gas having as an incipient ingredient a halogen-containing gas and an optional oxygen-containing gas. The process gas may further include a noble gas. As an example, the second etch process may include forming plasma using a process gas containing HBr and $O_2$. As another example, the second etch process may include forming plasma using a process gas further containing He.

Process sequence 200 may further include repeating a portion of the process sequence 200, as illustrated in 201B, 202B, and 203B, to form stepped structure 250 having one or more steps (252, 254).

The inventor has determined that performing the mask trim process prior to the second etch process substantially avoids or reduces the adverse effects the second etch process has on mask layer 230 and the mask trim process. Once the mask trim process is performed, thus, exposing another portion 245 of the one or more layers of the first composition (225A, 225B), a first layer of the first composition 225A may serve as a hard mask and a second layer of the first composition 225B may serve as an etch stop when performing the second etch process to transfer the first layer pattern 221 to the one or more layers of the second composition (220A, 220B).

The inventor has also determined that the second etch process passivates at least a portion of the mask layer 230 to produce a passivation sub-layer, which may improve profile control of the mask pattern 231 in mask layer 230 during the first etch process performed in a subsequent cycle. Furthermore, the inventor has determined that the first etch process performed in the subsequent cycle removes the passivation sub-layer from the mask layer 230, thus, facilitating the following mask trim process in the subsequent cycle.

In alternate embodiments, the mask layer 230 may be exposed to thermal treatment, plasma treatment, electron beam treatment, ion beam treatment, or gas cluster ion beam treatment, or any combination of two or more thereof before, during, and/or after the trimming of mask layer 230.

Figure 4:
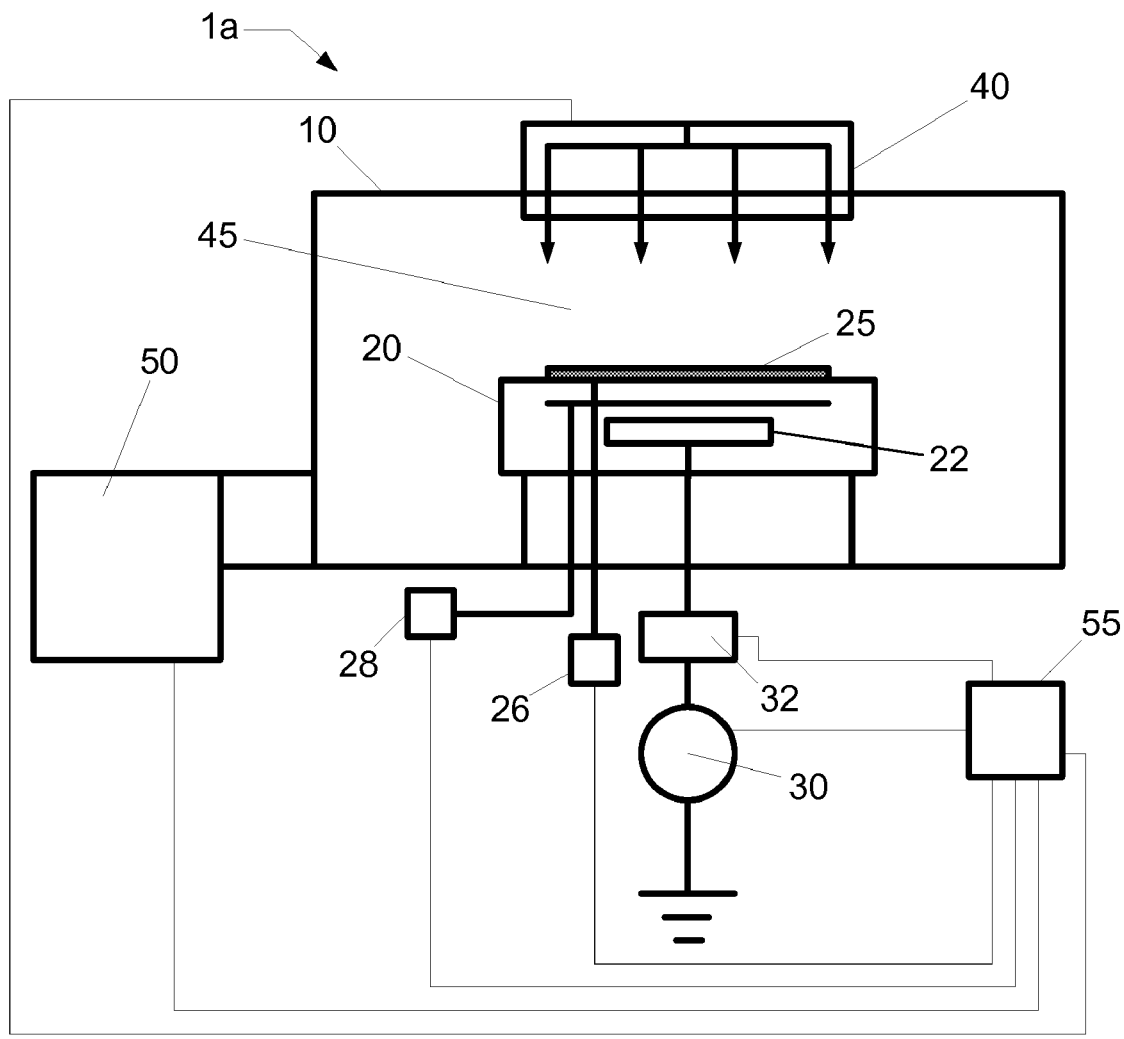
FIG. 4 shows a schematic representation of a plasma processing system according to an embodiment.

According to one embodiment, a plasma processing system 1a configured to perform the above identified process conditions is depicted in FIG. 4 comprising a plasma processing chamber 10, substrate holder 20, upon which a substrate 25 to be processed is affixed, and vacuum pumping system 50. Substrate 25 can be a semiconductor substrate, a wafer, a flat panel display, or a liquid crystal display. Plasma processing chamber 10 can be configured to facilitate the generation of plasma in plasma processing region 45 in the vicinity of a surface of substrate 25. An ionizable gas or mixture of process gases is introduced via a gas distribution system 40. For a given flow of process gas, the process pressure is adjusted using the vacuum pumping system 50. Plasma can be utilized to create materials specific to a pre-determined materials process, and/or to aid the removal of material from the exposed surfaces of substrate 25. The plasma processing system 1a can be configured to process substrates of any desired size, such as 200 mm substrates, 300 mm substrates, or larger.

Substrate 25 can be affixed to the substrate holder 20 via a clamping system 28, such as a mechanical clamping system or an electrical clamping system (e.g., an electrostatic clamping system). Furthermore, substrate holder 20 can include a heating system (not shown) or a cooling system (not shown) that is configured to adjust and/or control the temperature of substrate holder 20 and substrate 25. The heating system or cooling system may comprise a re-circulating flow of heat transfer fluid that receives heat from substrate holder 20 and transfers heat to a heat exchanger system (not shown) when cooling, or transfers heat from the heat exchanger system to substrate holder 20 when heating. In other embodiments, heating/cooling elements, such as resistive heating elements, or thermo-electric heaters/coolers can be included in the substrate holder 20, as well as the chamber wall of the plasma processing chamber 10 and any other component within the plasma processing system 1a.

Additionally, a heat transfer gas can be delivered to the backside of substrate 25 via a backside gas supply system 26 in order to improve the gas-gap thermal conductance between substrate 25 and substrate holder 20. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 25.

In the embodiment shown in FIG. 4, substrate holder 20 can comprise an electrode 22 through which RF power is coupled to the processing plasma in plasma processing region 45. For example, substrate holder 20 can be electrically biased at a RF voltage via the transmission of RF power from a RF generator 30 through an optional impedance match network 32 to substrate holder 20. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Alternately, RF power is applied to the substrate holder electrode at multiple frequencies. Furthermore, impedance match network 32 can improve the transfer of RF power to plasma in plasma processing chamber 10 by reducing the reflected power. Match network topologies (e.g. L-type, π-type, T-type, etc.) and automatic control methods are well known to those skilled in the art.

Gas distribution system 40 may comprise a showerhead design for introducing a mixture of process gases. Alternatively, gas distribution system 40 may comprise a multi-zone showerhead design for introducing a mixture of process gases and adjusting the distribution of the mixture of process gases above substrate 25. For example, the multi-zone showerhead design may be configured to adjust the process gas flow or composition to a substantially peripheral region above substrate 25 relative to the amount of process gas flow or composition to a substantially central region above substrate 25.

Vacuum pumping system 50 can include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 10.

Controller 55 comprises a microprocessor, memory, and a digital I/O port capable of generating control voltages sufficient to communicate and activate inputs to plasma processing system 1a as well as monitor outputs from plasma processing system 1a. Moreover, controller 55 can be coupled to and can exchange information with RF generator 30, impedance match network 32, the gas distribution system 40, vacuum pumping system 50, as well as the substrate heating/cooling system (not shown), the backside gas supply system 26, and/or the electrostatic clamping system 28. For example, a program stored in the memory can be utilized to activate the inputs to the aforementioned components of plasma processing system 1a according to a process recipe in order to perform a plasma assisted process, such as a plasma etch process, on substrate 25.

Controller 55 can be locally located relative to the plasma processing system 1a, or it can be remotely located relative to the plasma processing system 1a. For example, controller 55 can exchange data with plasma processing system 1a using a direct connection, an intranet, and/or the internet. Controller 55 can be coupled to an intranet at, for example, a customer site (i.e., a device maker, etc.), or it can be coupled to an intranet at, for example, a vendor site (i.e., an equipment manufacturer). Alternatively or additionally, controller 55 can be coupled to the internet. Furthermore, another computer (i.e., controller, server, etc.) can access controller 55 to exchange data via a direct connection, an intranet, and/or the internet.

In the embodiment shown in FIG. 5, plasma processing system 1b can be similar to the embodiment of FIG. 4 and further comprise either a stationary, or mechanically or electrically rotating magnetic field system 60, in order to potentially increase plasma density and/or improve plasma processing uniformity, in addition to those components described with reference to FIG. 4. Moreover, controller 55 can be coupled to magnetic field system 60 in order to regulate the speed of rotation and field strength. The design and implementation of a rotating magnetic field is well known to those skilled in the art.

Figure 5:
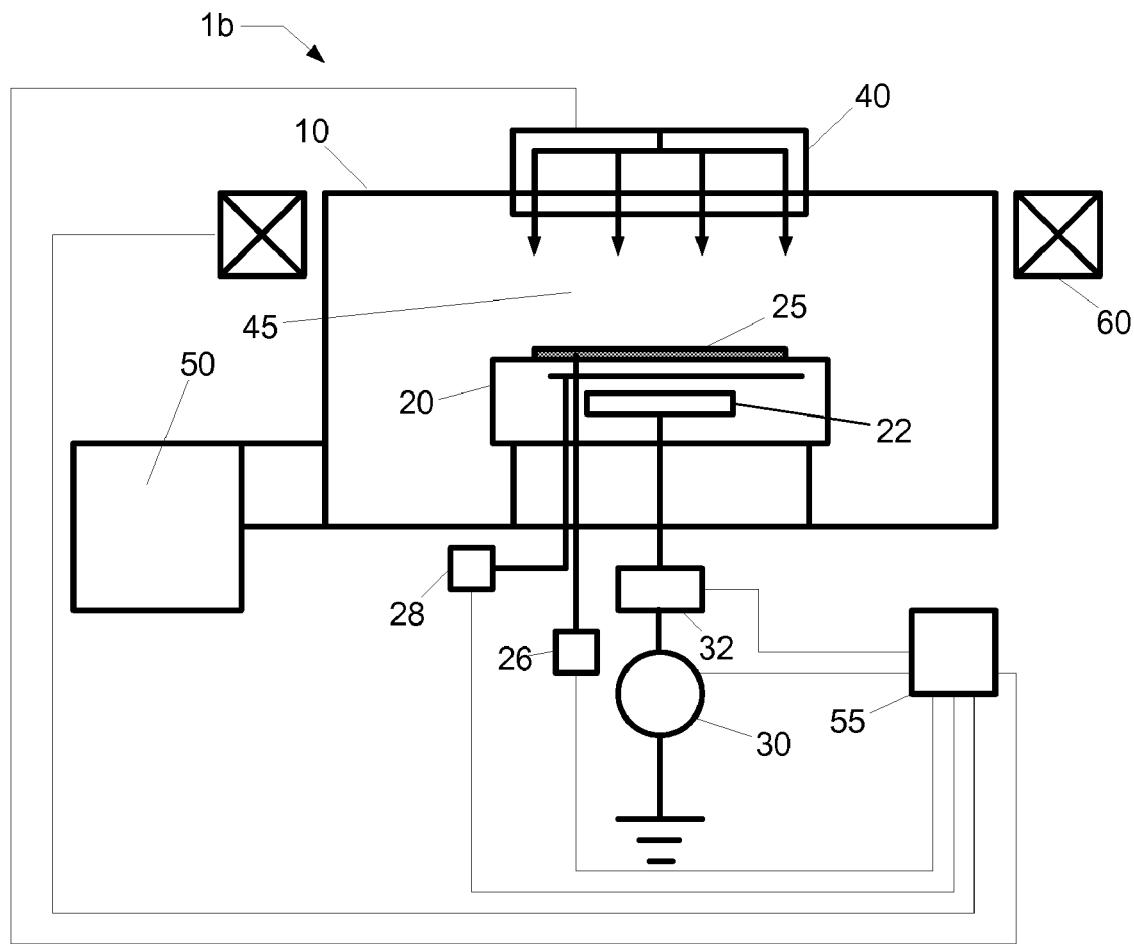
FIG. 5 shows a schematic representation of a plasma processing system according to another embodiment.
Figure 6:
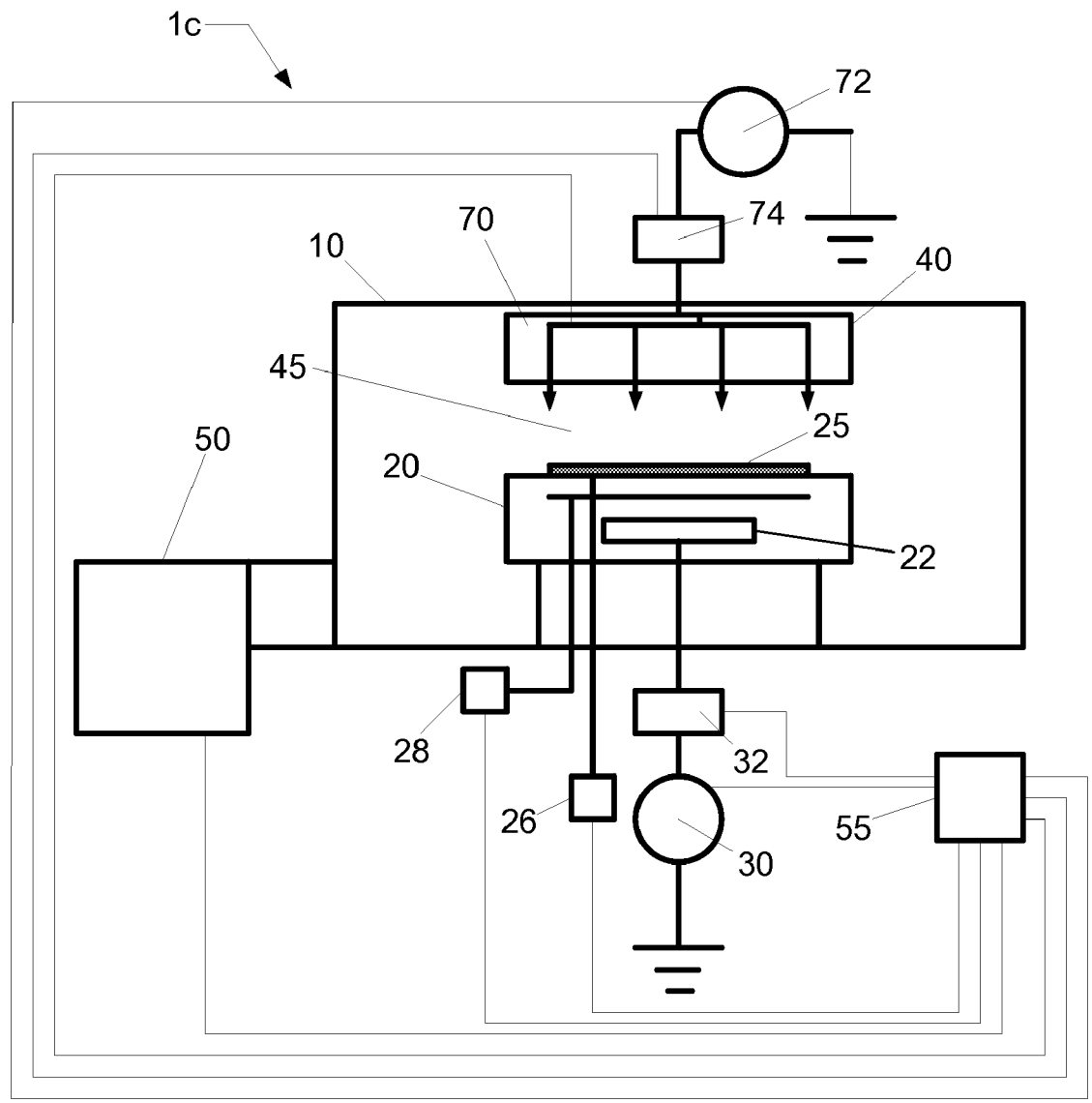
FIG. 6 shows a schematic representation of a plasma processing system according to another embodiment.

In the embodiment shown in FIG. 6, plasma processing system 1c can be similar to the embodiment of FIG. 4 or FIG. 5, and can further comprise an upper electrode 70 to which RF power can be coupled from RF generator 72 through optional impedance match network 74. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 55 is coupled to RF generator 72 and impedance match network 74 in order to control the application of RF power to upper electrode 70. The design and implementation of an upper electrode is well known to those skilled in the art. The upper electrode 70 and the gas distribution system 40 can be designed within the same chamber assembly, as shown.

Figure 7:
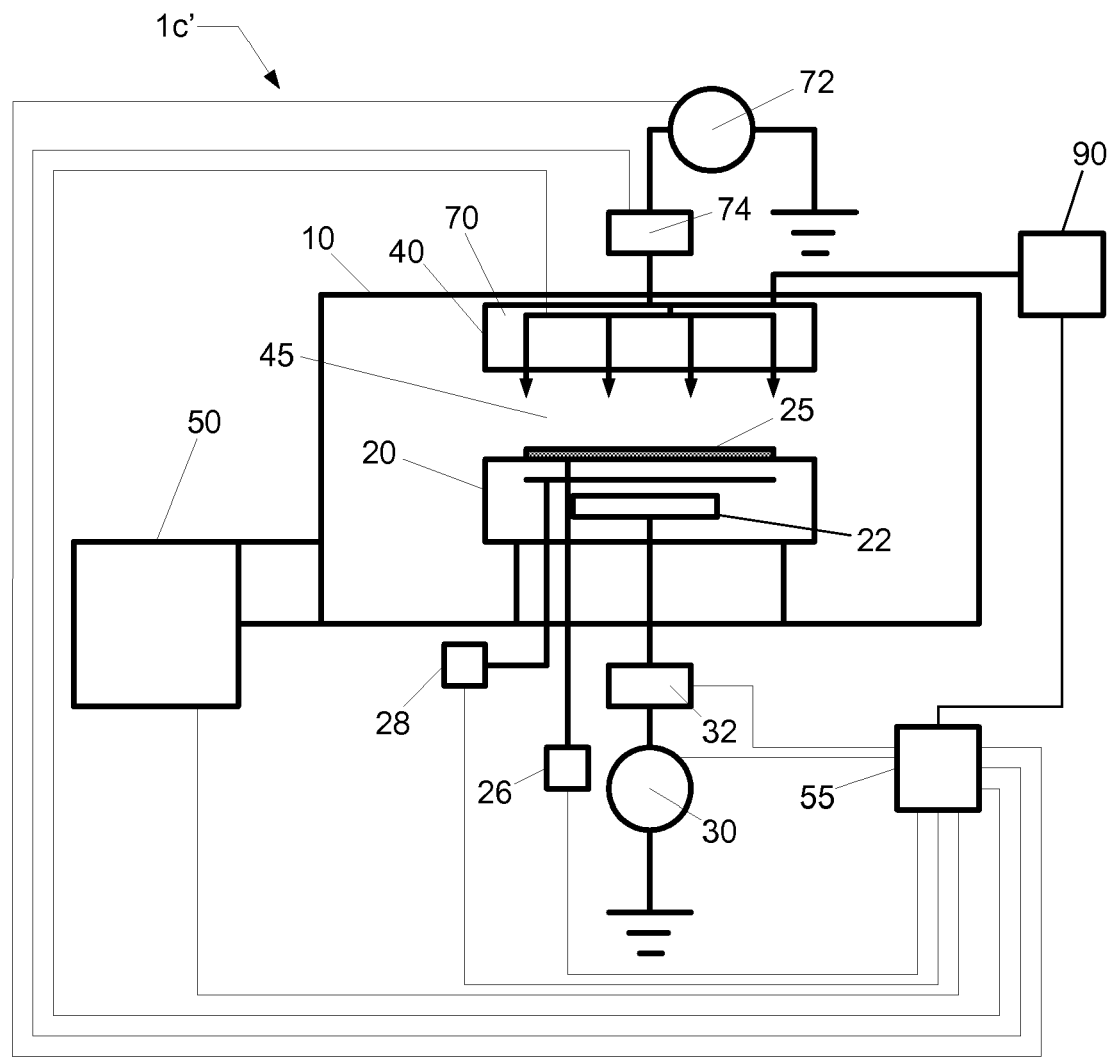
FIG. 7 shows a schematic representation of a plasma processing system according to another embodiment.

In the embodiment shown in FIG. 7, plasma processing system 1c' can be similar to the embodiment of FIG. 6, and can further comprise a direct current (DC) power supply 90 coupled to the upper electrode 70 opposing substrate 25. The upper electrode 70 may comprise an electrode plate. The electrode plate may comprise a silicon-containing electrode plate. Moreover, the electrode plate may comprise a doped silicon electrode plate. The DC power supply 90 can include a variable DC power supply. Additionally, the DC power supply 90 can include a bipolar DC power supply. The DC power supply 90 can further include a system configured to perform at least one of monitoring, adjusting, or controlling the polarity, current, voltage, or on/off state of the DC power supply 90. Once plasma is formed, the DC power supply 90 facilitates the formation of a ballistic electron beam. An electrical filter (not shown) may be utilized to de-couple RF power from the DC power supply 90.

For example, the DC voltage applied to upper electrode 70 by DC power supply 90 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 70. The surface of the upper electrode 70 facing the substrate holder 20 may be comprised of a silicon-containing material.

Figure 8:
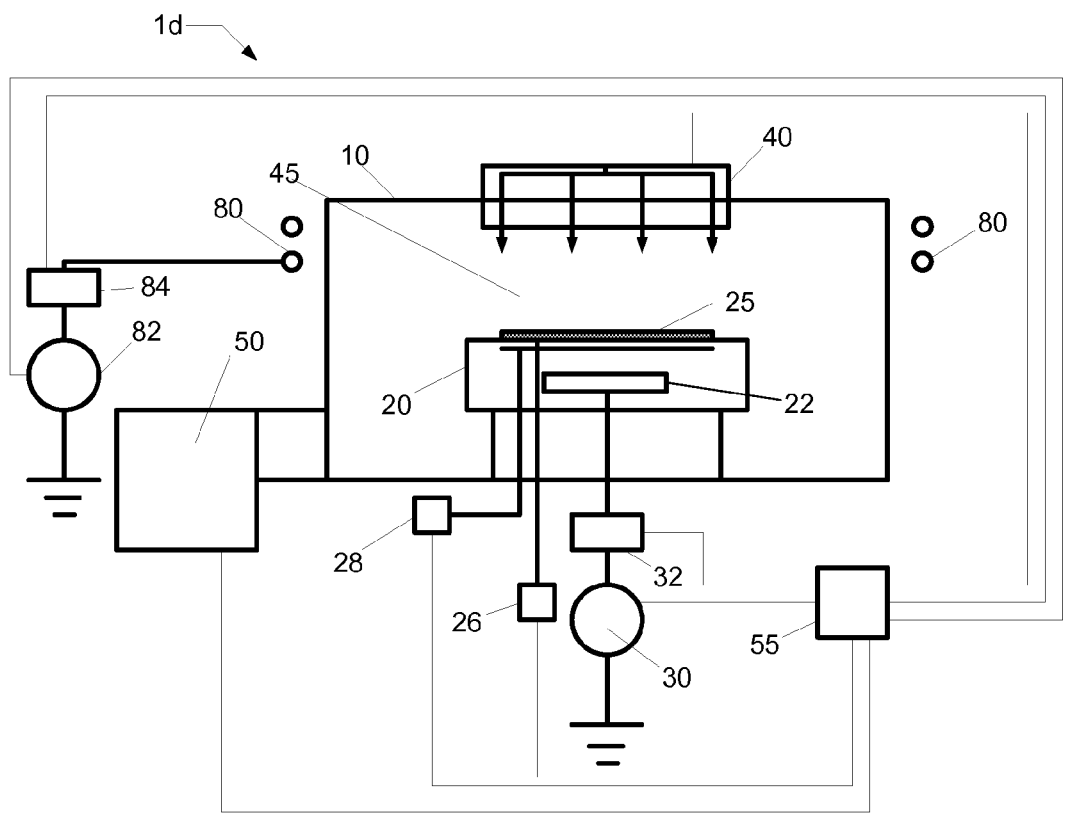
FIG. 8 shows a schematic representation of a plasma processing system according to another embodiment.

In the embodiment shown in FIG. 8, plasma processing system 1d can be similar to the embodiments of FIGS. 4 and 5, and can further comprise an inductive coil 80 to which RF power is coupled via RF generator 82 through optional impedance match network 84. RF power is inductively coupled from inductive coil 80 through a dielectric window (not shown) to plasma processing region 45. A frequency for the application of RF power to the inductive coil 80 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 80 and plasma in the plasma processing region 45. Moreover, controller 55 can be coupled to RF generator 82 and impedance match network 84 in order to control the application of power to inductive coil 80.

Figure 9:
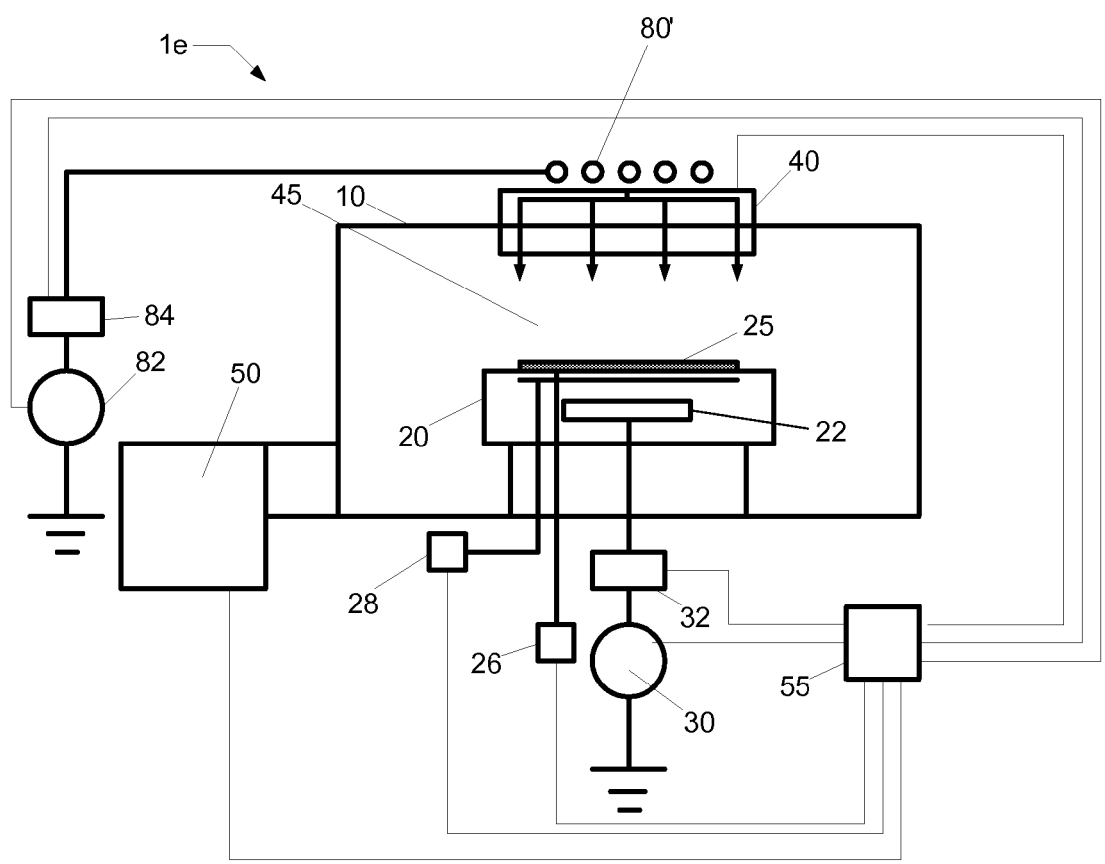
FIG. 9 shows a schematic representation of a plasma processing system according to another embodiment.

In an alternate embodiment, as shown in FIG. 9, plasma processing system 1e can be similar to the embodiment of FIG. 8, and can further comprise an inductive coil 80' that is a "spiral" coil or "pancake" coil in communication with the plasma processing region 45 from above as in a transformer coupled plasma (TCP) reactor. The design and implementation of an inductively coupled plasma (ICP) source, or transformer coupled plasma (TCP) source, is well known to those skilled in the art.

Alternately, plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 10:
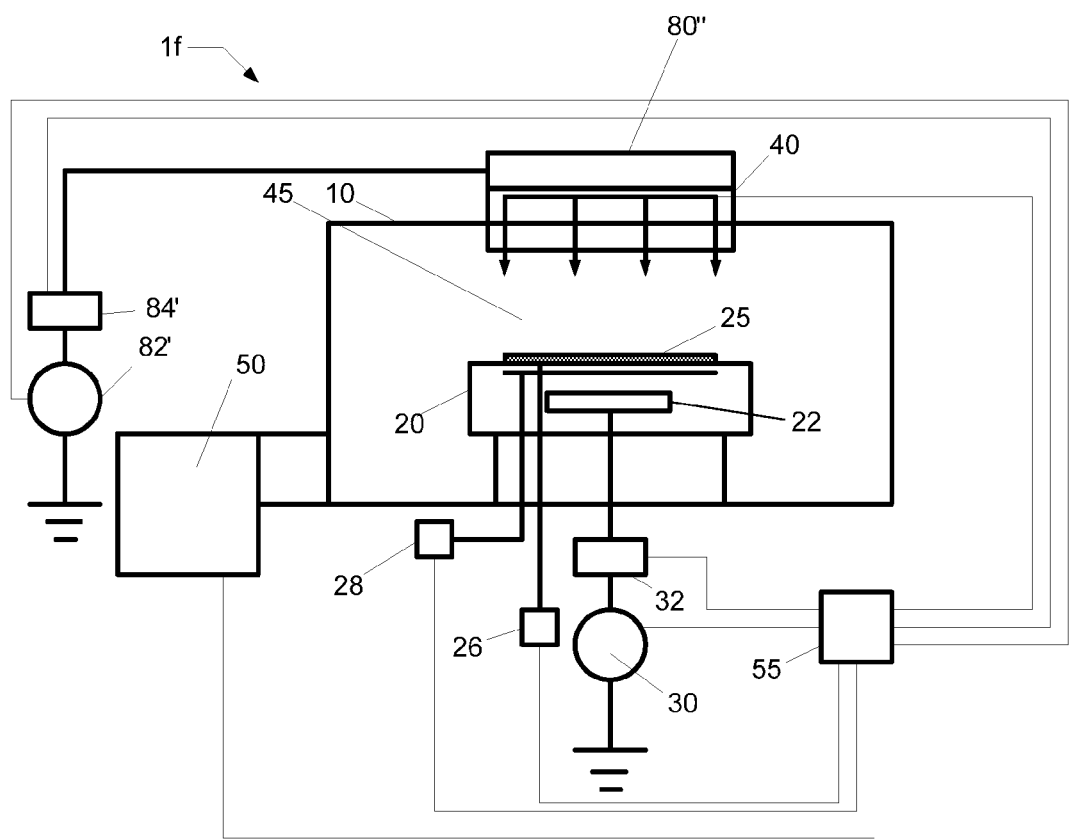
FIG. 10 shows a schematic representation of a plasma processing system according to another embodiment.

In the embodiment shown in FIG. 10, plasma processing system if can be similar to the embodiment of FIG. 4, and can further comprise a surface wave plasma (SWP) source 80". The SWP source 80" can comprise a slot antenna, such as a radial line slot antenna (RLSA), to which microwave power is coupled via microwave generator 82' through optional impedance match network 84'.

In one embodiment, the first etch process may comprise a process parameter space that includes: a chamber pressure ranging up to about 1000 mtorr (millitorr) (e.g., up to about 200 mtorr, or up to about 50 to 150 mtorr), a process gas flow rate ranging up to about 2000 sccm (standard cubic centimeters per minute) (e.g., up to about 1000 sccm, or about 1 sccm to about 200 sccm, or about 50 sccm to about 150 sccm), an optional additive gas process gas flow rate ranging up to about 2000 sccm (e.g., up to about 1000 sccm, or about 1 sccm to about 100 sccm), a noble gas process gas flow rate ranging up to about 2000 sccm (e.g., up to about 1000 sccm), an upper electrode (e.g., element 70 in FIG. 6) RF bias ranging up to about 2000 W (watts) (e.g., up to about 1000 W, or up to about 600 W), and a lower electrode (e.g., element 22 in FIG. 6) RF bias ranging up to about 1000 W (e.g., up to about 600 W, or up to about 100 W). Also, the upper electrode bias frequency can range from about 0.1 MHz to about 200 MHz, e.g., about 60 MHz. In addition, the lower electrode bias frequency can range from about 0.1 MHz to about 100 MHz, e.g., about 2 MHz.

In another embodiment, the mask trim process may comprise a process parameter space that includes: a chamber pressure ranging up to about 1000 mtorr (millitorr) (e.g., up to about 200 mtorr, or up to about 50 to 150 mtorr), a process gas flow rate ranging up to about 2000 sccm (standard cubic centimeters per minute) (e.g., up to about 1000 sccm, or about 1 sccm to about 300 sccm, or about 100 sccm to about 250 sccm), an optional additive gas process gas flow rate ranging up to about 2000 sccm (e.g., up to about 1000 sccm, or about 1 sccm to about 100 sccm), a noble gas process gas flow rate ranging up to about 2000 sccm (e.g., up to about 1000 sccm), an upper electrode (e.g., element 70 in FIG. 6) RF bias ranging up to about 2000 W (watts) (e.g., up to about 1000 W, or up to about 600 W), and a lower electrode (e.g., element 22 in FIG. 6) RF bias ranging up to about 1000 W (e.g., up to about 600 W, or up to about 100 W). Also, the upper electrode bias frequency can range from about 0.1 MHz to about 200 MHz, e.g., about 60 MHz. In addition, the lower electrode bias frequency can range from about 0.1 MHz to about 100 MHz, e.g., about 2 MHz.

In yet another embodiment, the second etch process may comprise a process parameter space that includes: a chamber pressure ranging up to about 1000 mtorr (millitorr) (e.g., up to about 200 mtorr, or up to about 50 to 150 mtorr), a process gas flow rate ranging up to about 2000 sccm (standard cubic centimeters per minute) (e.g., up to about 1000 sccm, or about 1 sccm to about 600 sccm, or about 100 sccm to about 600 sccm), an optional additive gas process gas flow rate ranging up to about 2000 sccm (e.g., up to about 1000 sccm, or about 1 sccm to about 100 sccm, or about 1 sccm to about 20 sccm), a noble gas process gas flow rate ranging up to about 2000 sccm (e.g., up to about 1000 sccm), an upper electrode (e.g., element 70 in FIG. 6) RF bias ranging up to about 2000 W (watts) (e.g., up to about 1000 W, or up to about 600 W), and a lower electrode (e.g., element 22 in FIG. 6) RF bias ranging up to about 1000 W (e.g., up to about 600 W, or up to about 100 W). Also, the upper electrode bias frequency can range from about 0.1 MHz to about 200 MHz, e.g., about 60 MHz. In addition, the lower electrode bias frequency can range from about 0.1 MHz to about 100 MHz, e.g., about 2 MHz.

As an example, Table 1 provides exemplary process conditions for preparing a stepped structure in a multi-layer film stack on a substrate using four (4) cycles, each cycle performing the first etch process, the mask trim process, and the second etch process in the specified order. The multi-layer film stack includes alternating layers of $SiO_2$ (or, more generally, $SiO_x$) and silicon, such as poly-Si.

W), a He flow rate (standard cubic centimeters per minute, sccm), an $O_2$ flow rate, an HBr flow rate, an $N_2$ flow rate, a $CF_4$ flow rate, a $CHF_3$ flow rate, an $NF_3$ flow rate, an $SF_6$ flow rate, a temperature set for components in the plasma processing chamber (° C.) ("UEL"=Upper electrode temperature; "W"=Wall temperature; "LEL-C"=Lower electrode center temperature; "LEL-E"=Lower electrode edge temperature), and a process (or etch) time.

The process condition also includes a power distribution parameter for the upper electrode (CPI). In some embodiments, the upper electrode may include a center electrode and an edge electrode. The value of the "CPI" parameter indicates the relative amount of RF power distributed to the center and edge electrodes. When CPI=36, the RF power coupled to the edge electrode is equal to the RF power coupled to the center electrode. When CPI is increased in value, more RF power is coupled to the center electrode.

The process condition further includes a gas flow distribution parameter for the upper electrode (RDC). In some embodiments, the upper electrode may include a center gas distribution zone and an edge gas distribution zone. The value of the "RDC" parameter indicates the relative amount of gas flow distributed to the center and edge gas distribution zones. When RDC=50, the gas flow coupled to the edge gas distribution zone is equal to the gas flow coupled to the center gas distribution zone.

TABLE 1

| Cycle | Process Step | Pressure (mTorr) | UEL RF (W) | LEL RF (W) | He | $O_2$ | HBr | $N_2$ | $CF_4$ | $CHF_3$ | $NF_3$ | $SF_6$ | CPI | RDC | BP CENTER (Torr) | BP EDGE (Torr) | TEMPS | Etch Time (sec) |
|---|---|---|---|---|---|---|---|---|---|---|---|---|---|---|---|---|---|---|
| 1 | Oxide Etch | 120 | 500 | 200 | | | | | 135 | 77 | | | 36 | 50 | 20 | 30 | 80/60/50/50/35 | 60 |
| | Mask Trim | 120 | 400 | 60 | | 200 | | 75 | | | | | 36 | 50 | 20 | 30 | 80/60/50/50/35 | 50 |
| | Poly-Si Etch | 20 | 200 | 250 | 200 | 2 | 400 | | | | | | 36 | 50 | 20 | 30 | 80/60/50/50/35 | 45 |
| 2 | Oxide Etch | 120 | 500 | 200 | | | | | 135 | 77 | | | 36 | 50 | 20 | 30 | 80/60/50/50/35 | 60 |
| | Mask Trim | 120 | 400 | 60 | | 200 | | 75 | | | | | 36 | 50 | 20 | 30 | 80/60/50/50/35 | 50 |
| | Poly-Si Etch | 20 | 200 | 250 | 200 | 2 | 400 | | | | | | 36 | 50 | 20 | 30 | 80/60/50/50/35 | 45 |
| 3 | Oxide Etch | 120 | 500 | 200 | | | | | 135 | 77 | | | 36 | 50 | 20 | 30 | 80/60/50/50/35 | 60 |
| | Mask Trim | 120 | 400 | 60 | | 200 | | 75 | | | | | 36 | 50 | 20 | 30 | 80/60/50/50/35 | 50 |
| | Poly-Si Etch | 20 | 200 | 250 | 200 | 2 | 400 | | | | | | 36 | 50 | 20 | 30 | 80/60/50/50/35 | 45 |
| 4 | Oxide Etch | 120 | 500 | 200 | | | | | 135 | 77 | | | 36 | 50 | 20 | 30 | 80/60/50/50/35 | 60 |
| | Mask Trim | 120 | 400 | 60 | | 200 | | 75 | | | | | 36 | 50 | 20 | 30 | 80/60/50/50/35 | 50 |
| | Poly-Si Etch | 20 | 200 | 250 | 200 | 2 | 400 | | | | | | 36 | 50 | 20 | 30 | 80/60/50/50/35 | 45 |

The first etch process, the mask trim process, and the second etch process use plasma formed from a process composition. The process composition for the first etch process ("Oxide Etch"), the mask trim process ("Mask Trim"), and the second etch process ("Poly-Si Etch") is as follows: (A) $CF_4$, $CHF_3$; (B) $O_2$, $N_2$; (C) He, $O_2$, HBr. However, other process compositions and/or process conditions are possible. The values for each process parameter are exemplary and may vary.

For the first etch process, the mask trim process, and the second etch process, a process condition is recited including a gas pressure (millitorr, mTorr) in the plasma processing chamber, an upper electrode (UEL) radio frequency (RF) power (watts, W), a lower electrode (LEL) RF power (watts, When the multi-layer mask includes alternating layers of $SiO_2$ and poly-Si, as described above, the second etch process passivates at least a portion of the mask layer to produce a passivation sub-layer, which may improve profile control of the mask pattern in the mask layer during the first etch process performed in a subsequent cycle (i.e., cycle 2, 3, 4, ... ). Based on the chemistry of the second etch process, the inventor surmises that the passivation sub-layer contains $SiBr_xO_y$, for example. Furthermore, the first etch process performed in the subsequent cycle removes the passivation sub-layer from the mask layer, thus, facilitating the following mask trim process in the subsequent cycle.

In alternate embodiments, RF power may be supplied to the upper electrode and not the lower electrode. In other alternate embodiments, RF power may be supplied to the lower electrode and not the upper electrode. In yet other alternate embodiments, RF power and/or DC power may be coupled in any of the manners described through FIGS. 4 to 10.

The time duration to perform a specific etching process may be determined using design of experiment (DOE) techniques or prior experience; however, it may also be determined using endpoint detection. One possible method of endpoint detection is to monitor a portion of the emitted light spectrum from the plasma region that indicates when a change in plasma chemistry occurs due to change or substantially near completion of the removal of a particular material layer from the substrate and contact with the underlying thin film. After emission levels corresponding to the monitored wavelengths cross a specified threshold (e.g., drop to substantially zero, drop below a particular level, or increase above a particular level), an endpoint can be considered to be reached. Various wavelengths, specific to the etch chemistry being used and the material layer being etched, may be used. Furthermore, the etch time can be extended to include a period of over-etch, wherein the over-etch period constitutes a fraction (i.e., 1 to 100%) of the time between initiation of the etch process and the time associated with endpoint detection.

One or more of the etching/trimming processes described above may be performed utilizing a plasma processing system such as the one described in FIG. 6. However, the methods discussed are not to be limited in scope by this exemplary presentation.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method for forming a stepped structure on a substrate, comprising:
    preparing a multi-layer film stack on a substrate having alternating layers of differing composition, wherein said alternating layers of differing composition include one or more layers of a first composition and one or more layers of a second composition;
    preparing a mask layer on said multi-layer film stack and forming a mask pattern in said mask layer to expose a portion of said one or more layers of said first composition; and
    preparing a stepped structure having one or more steps using a process sequence comprising the following:
        transferring said mask pattern to said one or more layers of said first composition to form a first layer pattern in said one or more layers of said first composition using a first etch process and stopping on said one or more layers of said second composition,
        trimming said mask pattern to expose another portion of said one or more layers of said first composition using a mask trim process, and
        following said trimming, transferring said first layer pattern to said one or more layers of said second composition using a second etch process and stopping on said one or more layers of said first composition.

2. The method of claim 1, further comprising:
    preparing said stepped structure having multiple steps by repeating said process sequence.

3. The method of claim 1, wherein said one or more layers of said first composition contain Si and O, and said one or more layers of said second composition contain Si.

4. The method of claim 1, wherein said one or more layers of said first composition consist of $SiO_2$, and said one or more layers of said second composition consist of polycrystalline silicon.

5. The method of claim 1, wherein said mask layer comprises one or more layers, said one or more layers including a soft mask layer, a hard mask layer, a layer of photoresist, an anti-reflective coating (ARC) layer, or an organic planarization layer (OPL), or any combination of two or more thereof.

6. The method of claim 1, further comprising:
    passivating at least a portion of said mask layer to produce a passivation sub-layer during said second etch process.

7. The method of claim 6, further comprising:
    removing said passivation sub-layer from said mask layer during said first etch process.

8. The method of claim 1, wherein said first etch process comprises forming plasma using a process gas having as an incipient ingredient a fluorocarbon gas, or a fluorohydrocarbon gas, or both a fluorocarbon gas and a fluorohydrocarbon gas.

9. The method of claim 8, wherein said process gas further comprises a noble gas.

10. The method of claim 1, wherein said first etch process comprises forming plasma using a process gas containing $CF_4$ and $CHF_3$.

11. The method of claim 1, wherein said second etch process comprises forming plasma using a process gas having as an incipient ingredient a halogen-containing gas and an optional oxygen-containing gas.

12. The method of claim 11, wherein said process gas further comprises a noble gas.

13. The method of claim 1, wherein said second etch process comprises forming plasma using a process gas containing HBr and $O_2$.

14. The method of claim 1, wherein said second etch process comprises forming plasma using a process gas further containing He.

15. The method of claim 1, wherein said mask trim process comprises forming plasma using a process gas having as an incipient ingredient an oxygen-containing gas, a nitrogen-containing gas, or a hydrogen-containing gas, or any combination of two or more thereof.

16. The method of claim 15, wherein said process gas further comprises a noble gas.

17. The method of claim 1, wherein said mask trim process comprises forming plasma using a process gas containing $O_2$, NO, $NO_2$, $N_2O$, CO, $CO_2$, or $N_2$, or any combination of two or more thereof.

18. The method of claim 1, wherein said mask trim process comprises forming plasma using a process gas containing $NH_3$, $H_2$, or $N_2$, or any combination of two or more thereof.

19. The method of claim 1, wherein said mask trim process comprises forming plasma using a process gas containing $NF_3$, or $SF_6$, or both $NF_3$ and $SF_6$.

20. The method of claim 1, further comprising:
    exposing said mask layer to thermal treatment, plasma treatment, electron beam treatment, ion beam treatment, or gas cluster ion beam treatment, or any combination of two or more thereof before, during, or after said trimming said mask layer.

* * * * *

UNITED STATES PATENT AND TRADEMARK OFFICE
CERTIFICATE OF CORRECTION

| | | |
|---|---|---|
| PATENT NO. | : 8,263,496 B1 | Page 1 of 1 |
| APPLICATION NO. | : 13/153266 | |
| DATED | : September 11, 2012 | |
| INVENTOR(S) | : Norman Wodecki | |

It is certified that error appears in the above-identified patent and that said Letters Patent is hereby corrected as shown below:

Column 8, line 20, "system if can be" should read --system 1f can be--.

Signed and Sealed this
Twenty-fifth Day of December, 2012

David J. Kappos
*Director of the United States Patent and Trademark Office*